(12) United States Patent
Grossman (10) Patent No.: US 11,082,022 B2
(45) Date of Patent: Aug. 3, 2021

(54) AUDIO EQUALIZATION SYSTEM AND METHOD

(71) Applicant: Dolby Laboratories Licensing Corporation, San Francisco, CA (US)

(72) Inventor: Ethan A. Grossman, Mill Valley, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 320 days.

(21) Appl. No.: 16/306,874

(22) PCT Filed: Jun. 6, 2017

(86) PCT No.: PCT/US2017/036064
§ 371 (c)(1),
(2) Date: Dec. 3, 2018

(87) PCT Pub. No.: WO2017/214086
PCT Pub. Date: Dec. 14, 2017

(65) Prior Publication Data
US 2021/0050834 A1      Feb. 18, 2021

Related U.S. Application Data

(60) Provisional application No. 62/346,657, filed on Jun. 7, 2016.

(30) Foreign Application Priority Data

Jun. 7, 2016  (EP) ..................................... 16173346

(51) Int. Cl.
*H03G 5/16*      (2006.01)
*G06F 3/16*      (2006.01)

(52) U.S. Cl.
CPC ............. *H03G 5/165* (2013.01); *G06F 3/165* (2013.01)

(58) Field of Classification Search
CPC .......... H03G 5/00; H03G 5/005; H03G 5/025; H03G 5/16; H03G 5/165; H03G 9/00;
(Continued)

(56) References Cited

U.S. PATENT DOCUMENTS

| 4,461,026 A | 7/1984 | Priniski |
| 5,506,910 A * | 4/1996 | Miller ...................... H03G 3/32 381/103 |

(Continued)

FOREIGN PATENT DOCUMENTS

| JP | 2006-254292 | 9/2006 |
| WO | 2014/038154 | 3/2014 |

OTHER PUBLICATIONS

Mcgrath, David S. "A New Approach to Digital Audio Equalization" AES 97th Convention, Nov. 10-13, 1994, New South Wales Australia, pp. 1-12.
(Continued)

*Primary Examiner* — Thang V Tran (57) ABSTRACT

A variable-resolution graphic equalizer providing an improved interface for controlling gain values across the entire audio spectrum using many narrow-band filters (e.g., 120). It allows user selection of a frequency range for graphic equalization and automatically maps a reduced and fixed number of sliders to the selected range based on the number of filter bands falling within the selected range. In an audio processing system, specific user interface regions are highlighted to display selected frequency ranges and corresponding selected sliders to allow for rapid and precise equalization of the full audio spectrum using the many narrow-band filters.

14 Claims, 5 Drawing Sheets

(58) Field of Classification Search
CPC ........ H03G 9/025; H03G 9/005; G06F 3/165; G06F 3/048; G06F 3/0484; G06F 3/04847
See application file for complete search history.

(56) References Cited

U.S. PATENT DOCUMENTS

| | | | |
|---|---|---|---|
| 6,317,117 B1 | 11/2001 | Goff | |
| 8,073,160 B1 | 12/2011 | Classen | |
| 2004/0184624 A1 | 9/2004 | Komiyama | |
| 2005/0157830 A1* | 7/2005 | Ota | H04H 60/04 375/377 |
| 2005/0256595 A1* | 11/2005 | Aiso | H04H 60/04 700/94 |
| 2006/0015198 A1* | 1/2006 | Okabayashi | G11B 27/034 700/94 |
| 2006/0232586 A1* | 10/2006 | Terada | G06T 11/206 345/440 |
| 2007/0061729 A1* | 3/2007 | Terada | H04H 60/04 715/727 |
| 2008/0175398 A1* | 7/2008 | Terada | H04R 3/005 381/56 |
| 2010/0246856 A1* | 9/2010 | Suzuki | G06F 3/04847 381/119 |
| 2014/0153745 A1 | 6/2014 | Mate | |
| 2015/0106711 A1* | 4/2015 | Virolainen | H03G 5/005 715/716 |
| 2015/0263871 A1* | 9/2015 | Terada | H03G 5/025 375/232 |
| 2016/0266867 A1* | 9/2016 | Olesh | G06F 3/165 |
| 2016/0299677 A1* | 10/2016 | Terada | H04H 60/04 |
| 2017/0126194 A1* | 5/2017 | Jot | H03G 5/025 |

OTHER PUBLICATIONS

Loviscach, Jorn "Graphical Control of a Parametric Equalizer" AES presented at the 124th Convention, May 17-20, 2008, Amsterdam, The Netherlands, pp. 1-9.

Music Group IP Limited: "M32 Digital Console-User Manual" Dec. 31, 2014, pp. 56-57.

* cited by examiner

AUDIO EQUALIZATION SYSTEM AND METHOD

CROSS-REFERENCED TO RELATED APPLICATIONS

This application claims priority from U.S. Application No. 62/346,657 filed Jun. 7, 2016 and European Patent Application No. 16173346.4 filed Jun. 7, 2016 which are hereby incorporated by reference in their entirety.

FIELD OF THE INVENTION

One or more implementations relate generally to graphical interfaces for audio processing, and more specifically to a user interface for a graphic equalizer with a large number of filter bands.

BACKGROUND

Equalization is used to adjust or level the frequency response of sound across the audio spectrum or portions of the audio spectrum (e.g., 20 Hz to 20 kHz). Equalizers cut or boost the energy of specific frequency bands to attain a desired frequency response characteristic. Equalization can be used to produce a flat frequency response across the spectrum by compensating for environmental or playback frequency response errors, or to enhance certain frequency ranges to enhance certain sound characteristics.

For music production and reproduction, graphic equalizers and parametric equalizers are among the most common type of equalizers used. A graphic equalizer uses several audio filter/amplifiers, each centered at a specific frequency in the audio range with corresponding slide or rotary potentiometer controls that allow a user to individually control and often see graphically the gain settings for each of these frequency bands. A parametric equalizer provides more specific control over a given frequency band by providing three adjustments: selection of the center frequency, adjustment of the bandwidth sharpness (Q), and the level or gain control for the center frequency.

Software implemented equalizers are often used as part of digital audio workstation (DAW) applications that are used to edit and produce audio files through graphical user interfaces and tools. An example of a software DAW is the popular Pro Tools program made by Avid Technology for use in MS-Windows and Apple Macintosh computers. The basic Pro Tools or other DAW program has software modules for a multi-track tape recorder and mixer, along with other digital processing functions that are presented to a user through a graphical user interface (GUI) that typically mimics the hardware product counterparts to allow the user to alter and mix multiple recordings and tracks into a final produced audio program (e.g., song, message, film score, etc.). Equalization functions through graphic, parametric, semi-parametric, peak, and program equalizers are often provided as part of the DAW suite, or as software plug-ins for the DAW program.

In addition, equalizers are commonly included in sound reproduction systems of many types, including those used to reproduce motion picture soundtracks in commercial cinemas. In this context equalizers are used to compensate for frequency response errors in the playback environment (e.g., theater or auditorium). In such applications there can be many speakers in the auditorium, for example current Dolby Atmos installations commonly have 40 or 50 or more speakers, each of which needs to be individually equalized. As a result, this equalization process is often automated ("Auto-EQ") which saves time for the operators, however the results must be reviewed (and often require manual correction) by the operators. As a result, EQ (controlled using either software or hardware) is typically incorporated into such systems even though they include Auto-EQ.

Present methods of controlling equalizers in an audio production or playback system are implemented using either a software GUI or a hardware system incorporating physical knobs or faders. Various products offer a wide variety of user interfaces for controlling the underlying equalization technology, ranging from very simple (one user control, e.g., a knob) to very complex (dozens of user controls) and one may be more suitable for a given application than others. For example, the GUI for the Lake processing module (formerly made by Dolby) requires the user to draw the desired equalization curve on a graph on a GUI, whereas a graphic equalizer implemented using dedicated knobs or sliders on a hardware device allows fast and intuitive control, but lacks the precision of the GUI graph.

Furthermore, the underlying EQ implementation affects what kind of control the user can exert over it. For example a graphic equalizer implementation typically consists of a relatively large number (e.g., 32) of individual EQ sections, each of which has a narrow range of adjustability, whereas a parametric equalizers typically consists of a small number (e.g., 3) of EQ sections each of which has a greater degree of adjustability. For an improved EQ interface, an important consideration is to use a graphic equalizer style of control using an underlying EQ implementation like the Lake Equalizer, which consists of an extraordinarily large number of graphic EQ-style elements (e.g., 120 controls) and is thus only amenable to certain types of human interfaces, for example drawing on a graph as currently implemented in current implementations of the Lake EQ product. Although this high band count gives an advantage in precision over the audio range of 20 Hz-20 kHz (i.e., 12 bands per octave rather than the conventional 3 bands per octave) it requires 12 controls for each of 10 octaves for a total of 120 controls, which is expensive for hardware interfaces and tedious to operate for both hardware and software user interfaces.

What is needed therefore, is a "hybrid" graphic equalizer interface that provides a simple control set that maps well into both hardware implementations and computer-based GUIs, and allows for comprehensive gain control over the audio frequency spectrum without requiring an excessive number of controls or graphics, and requiring the minimum amount of work on the part of the user to achieve a certain gain curve, that is, an efficient workflow.

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

BRIEF SUMMARY OF EMBODIMENTS

Embodiments are generally directed to an equalizer system and method of controlling an equalizer by adjusting gain values for frequency bands through a first equalizer UI section having a plurality of faders each of which sets gain values for a specific set of underlying EQ elements assigned to that fader, and a second equalizer UI section selecting a frequency range for equalization by the first equalizer section. The second equalizer UI section determines a frequency range over which the first UI section operates, automatically assigning a group of one or more underlying EQ elements to each fader in the first UI section.

Embodiments include a method of providing control over an audio equalizer by providing a first set of controls to equalize frequency response across an audio spectrum wherein each control of the first set of controls sets gain values for a plurality of underlying EQ elements assigned to that control, in a manner similar to a graphic equalizer in which each single fader controls a plurality of underlying graphic EQ elements, and providing a second set of controls which define the operation of the first set of controls. To achieve this, the second set of controls includes two controls that between them define a frequency range; the first sets a lower frequency limit value and the second sets an upper frequency limit value. This frequency range is used to determine the behavior of each control in the first set of controls, assigning to that control a specific set of underlying EQ elements (similar to a fixed center frequency and Q element of a graphic EQ) and determining how the setting of the control affects the gain values thereby transmitted to the underlying EQ elements. The use of an algorithm to determine the behavior of the fader implies that the values transmitted by the fader to its underlying EQ elements may or may not be linearly related to the setting of the fader control; for example, smoothing, curve-fitting, or other refinements may be utilized to achieve the desired resulting overall frequency curve of the equalizer system as a result of moving a given fader.

The first set of controls may be provided as faders implemented as linear variable resistance devices in a graphic equalizer format (in hardware) or as a graphical representation of a fader in a software GUI, or in any other mechanical or graphical form, with the result that each fader always represents an audio gain value, positive or negative or zero, in decibel (dB) or other units. The second set of controls may be provided as rotary knobs (e.g., potentiometers in a hardware implementation, or graphical widgets in a software GUI) or in any other mechanical or graphical form, with the result that each control contributes to defining a frequency range with a lower and upper frequency limit, for example in Hz. An example second control set might consist of Lower Frequency Limit, Upper Frequency Limit, and Offset that simultaneously adjusts the effect of the first two controls so as to move the selected range up or down the overall frequency spectrum. As an example, if the lower limit is set to 20 Hz and the upper limit is set to 100 Hz, this results in a range of width of 80 Hz and increasing the Offset control value by a value of 100 Hz would shift that 80 Hz frequency range to 120 Hz-200 Hz. This provides only an example of how the second set of controls might define a frequency range, and many other arrangements are possible, for example adjusting boundary lines on a graph on a GUI or employing a touch-sensitive hardware device.

The controls may comprise graphical user interface elements controlling gain characteristics across the audio spectrum for any application where an equalizer is used today or in the future, for example in processing audio files in a DAW or processing live audio at a concert or film screening.

In an embodiment there may be any number of underlying EQ elements and any number of faders in the first control section. In a specific example of 120 underlying EQ elements and 8 faders in the first control set, if the frequency range is set by the second controls to 20 Hz to 20 kHz then each fader controls 15 (120/8=15) EQ elements. As another example, for the most narrow frequency range supported in this example configuration, each fader would control exactly one EQ element, allowing 1/12 octave precision control for each the 8 faders.

In an embodiment, the first and second control sets are provided as software elements in a software implemented equalizer program, wherein the frequency range set by the second control set is displayed on a frequency response graph of the graphical user interface. In addition, the EQ curve resulting from the combined settings of both control sets may be shown on the frequency response graph. Other related information may also be overlaid on the frequency response graph, for example a Fourier style frequency domain plot of the live audio signal. Other related EQ controls may also be present in the EQ GUI for example a selector between "replace" and "add" modes which determines whether the effect of moving a fader is to offset any existing EQ curve in the current area of control of that fader, or whether to completely replace it with the curve segment corresponding to the new fader value.

Embodiments are further directed to an equalizer system adjusting gain values for frequency components across a spectrum having a first set of equalizer controls comprising a plurality of faders, each fader setting gain values for a unique center frequency in the audio spectrum; and a second set of equalizer controls selecting a frequency range for equalization by the first set of equalizer controls and automatically mapping a subset of faders of the plurality of faders to the selected frequency range based on a number of filter bands falling within the selected frequency range. In the system, the first control of the second set of equalizer controls selects a center frequency for the subset of faders, and the second and third controls of the second set of equalizer controls define the width (in Hz) of the frequency range around the given center frequency. The result of these user interface settings on the underlying EQ implementation is that each fader is assigned a group of the underlying set of EQ elements, which are computed by an algorithm to correspond to the selected frequency range. The first set of equalizer controls may be consist of a graphic equalizer style arrangement of 8 or 16 individual faders, and the underlying graphic EQ implementation may comprise a 120-band equalizer having 120 individual narrow-band filters applying gain values set by the plurality of faders. The equalizer system may be a hardware component for a hardware-based audio processing system, or it may be a software program used in an audio production or reproduction system having a graphical user interface (GUI) for user control of EQ in the process of producing or reproducing audio content.

Embodiments are further described for a graphical user interface for controlling a graphic equalizer in a digital audio processing product, having a display area showing a frequency response graph, such as a frequency response bar chart or a frequency response curve, over the audible frequency spectrum of 20 Hz to 20 kHz; a graphic equalizer display area showing a plurality of faders controlling gain values for respective center frequencies of the spectrum; and a method within the GUI (for example a set of controls) whose purpose is to select a frequency range for equalization by the graphic equalizer and automatically map each of the plurality of faders to a corresponding frequency range to be implemented as a number of EQ filter elements falling within the selected frequency range, and with gain adjustments to the individual underlying EQ elements as initiated by a movement of a fader and subsequently determined by an algorithm. The selected frequency range is indicated on the display as a highlighted portion of the display area, and the subset of faders is displayed as another highlighted portion of the display area. The set of frequency range selection controls in the display area may comprise a left frequency knob, a right frequency knob, and an offset knob for controlling an offset between the right and left frequencies.

Embodiments are yet further directed to methods of making and using or deploying an equalizer under some embodiments as part of an audio production or reproduction system.

INCORPORATION BY REFERENCE

Each publication, patent, and/or patent application mentioned in this specification is herein incorporated by reference in its entirety to the same extent as if each individual publication and/or patent application was specifically and individually indicated to be incorporated by reference.

BRIEF DESCRIPTION OF THE DRAWINGS

In the following drawings like reference numbers are used to refer to like elements. Although the following figures depict various examples, the one or more implementations are not limited to the examples depicted in the figures.

DETAILED DESCRIPTION

Systems and methods are described for a user interface for controlling a graphic equalizer implementation, which consists of a large number of filter elements (e.g., twelve elements per octave over 10 octaves for a total of 120 filter elements). The interface represents a hybrid between a user interface for a graphical equalizer and a user interface for a parametric equalizer. Specifically, the interface presents a certain number of sliders (e.g., eight) to the user, along with a method of selecting a frequency range over which the sliders operate. An example set of controls for selecting a frequency range might consist of three knobs which include (1) a lower frequency knob, (2) an upper frequency knob, and (3) an offset knob (which slides the whole range selected by the first two knobs up or down in the frequency range).

Aspects of the one or more embodiments described herein may be implemented in any audio production or reproduction system that processes audio content. The implementation may be in principle be implemented in either the analog or the digital domain, however a common implementation is in the digital domain, using one or more computers or processing devices executing software instructions. Any of the described embodiments may be used alone or together with one another in any combination. Although various embodiments may have been motivated by various deficiencies with the prior art, which may be discussed or alluded to in one or more places in the specification, the embodiments do not necessarily address any of these deficiencies. In other words, different embodiments may address different deficiencies that may be discussed in the specification. Some embodiments may only partially address some deficiencies or just one deficiency that may be discussed in the specification, and some embodiments may not address any of these deficiencies.

Figure 1:
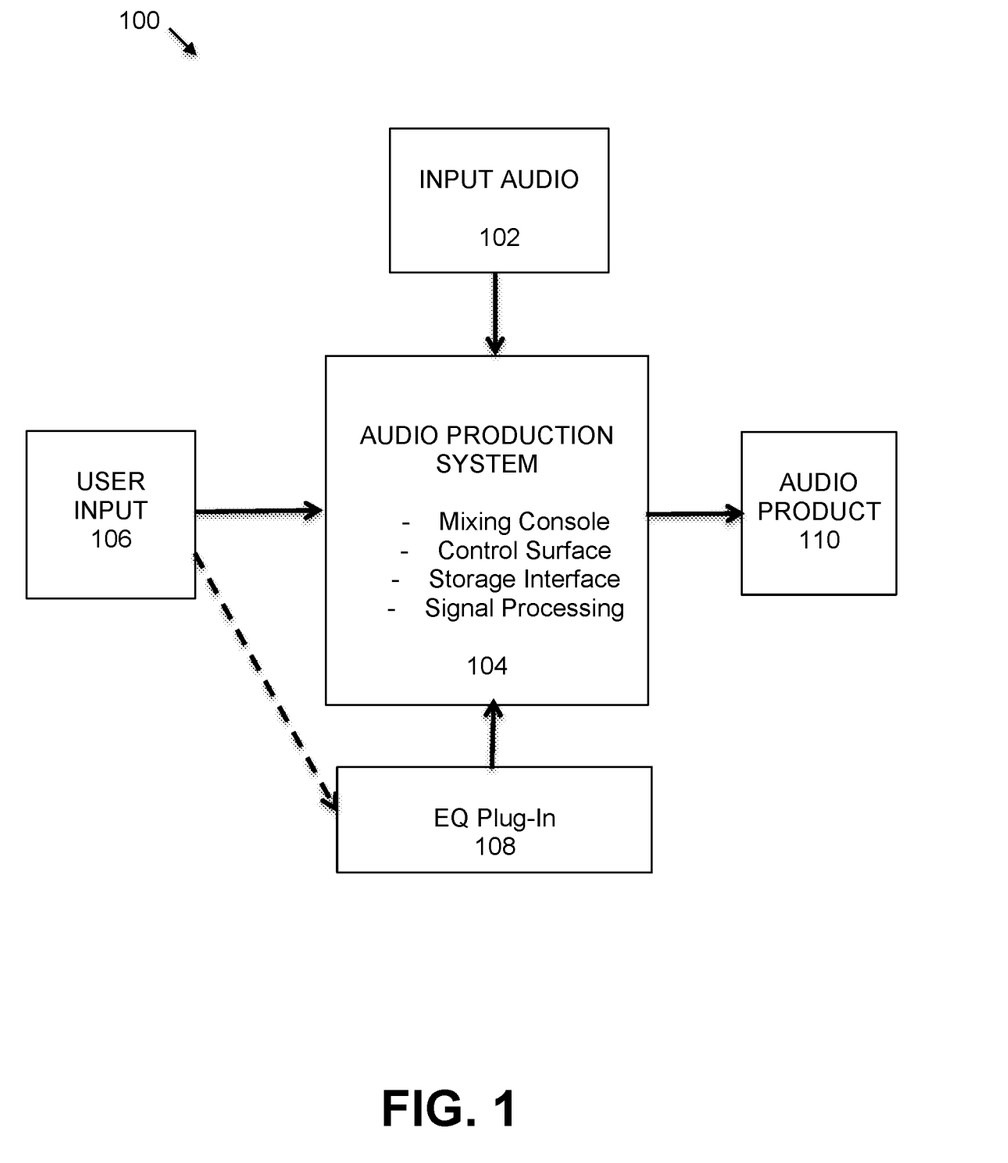
FIG. 1 illustrates a digital audio system utilizing an equalizer interface according to some embodiments.

FIG. 1 illustrates an audio processing system utilizing an equalizer interface according to some embodiments. Such an interface to an equalizer (EQ) function or process implemented in either software or hardware may be referred to herein as a "hybrid equalizer" or "variable resolution graphic equalizer." As shown in system 100 of FIG. 1, input audio 102, such as an audio stream is processed by an audio system 104 to produce a final audio product 110. The input and processed audio may comprise any type of audio content such as a music, dialog, sound effects, ambient noise, and so on, and may be stored in any appropriate digital format for audio processing. In an embodiment, the audio system 104 is embodied as a computer software application for recording, processing, and producing or reproducing the input audio stream 102, and may be executed as an application on a single computer (e.g., desktop or laptop computer) or as a stand-alone unit (e.g., an embedded computer based audio device), or in a network of computers accessed through a central user interface. The interface for the audio system 104 provides GUI tools to allow the user to input 106 settings and commands to alter and mix the audio stream 102 to produce the final product 110.

The audio system 104 may be an integrated system that may include any of a mixing control surface (e.g., 24 or 48 track mixer), audio input/output interface, audio format converter, and one or more signal processing functions. The controls may be presented to the user through a GUI that is represented as a graphic representation of familiar hardware components, such as a mixing console (e.g., with faders and pots), audio recorder (e.g., with play/stop/pause buttons), and frequency response output plots. User input 106 includes an interface that allows the user to graphically manipulate the GUI input and display controls as if the user were controlling actual hardware devices.

In an embodiment, the audio system 104 may include several signal processing modules that modify the audio stream 102, through functions such as filtering, gain control and so on. One or more equalization functions may also be provided as part of the product 104. Alternatively, the equalization function may be provided through a plug-in program 108 that interfaces with the product software through an API (application programming interface) or similar mechanism. With respect to the following disclosure, although embodiments may be described with respect to an equalizer or equalizer functions provided by plug-in 108, it should be noted that such an equalizer may be implemented as a native or integrated equalizer within the audio system or its software 104.

Figure 2A:
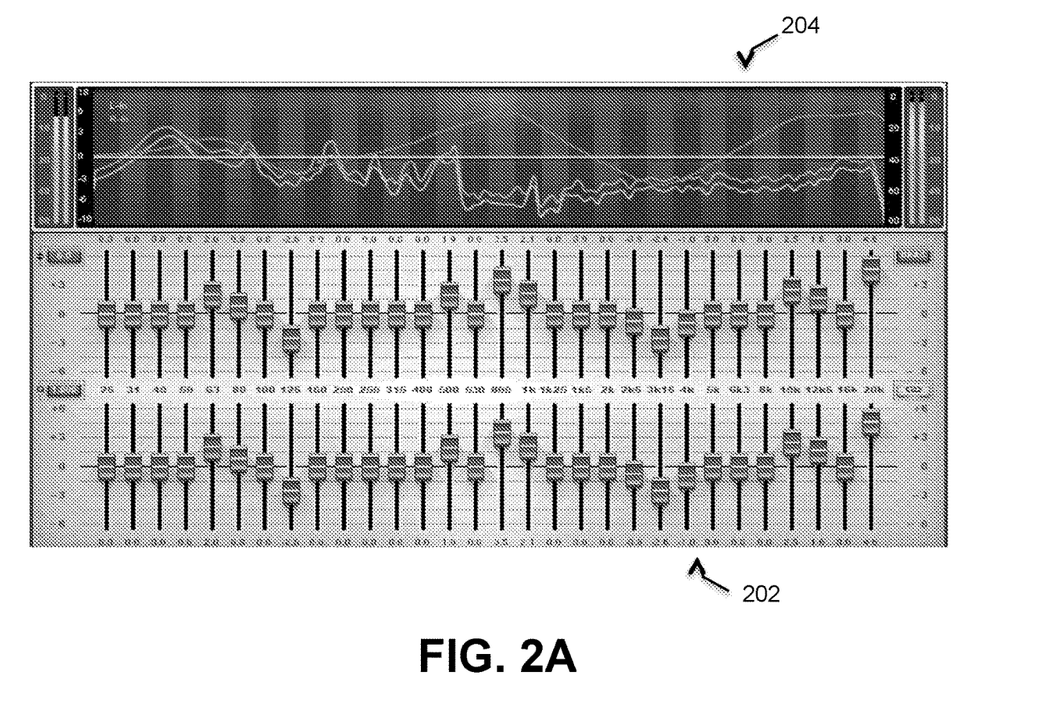
FIG. 2A illustrates an example graphic equalizer interface that can be controlled through a DAW user interface according to some embodiments.

The equalizer 108 represents a graphic equalizer that provides individual gain control over specific frequencies through the setting of virtual slider or fader controls. FIG. 2A illustrates an example graphic equalizer interface that can be controlled through a GUI according to some embodiments. As shown in FIG. 2A, the graphic equalizer 202 comprises a first bank of sliders for one channel of a stereo audio file, and a second bank of sliders for the second channel Each slider controls the gain for a specific frequency or frequency range centered around that specific frequency. The sliders determine the gain setting (increase or decrease, e.g., over a range of +6 dB) for each corresponding frequency. The example of FIG. 2A illustrates a 30-band graphic equalizer with center frequencies set at intervals of 3 bands per octave across the 20 Hz to 20 kHz spectrum, starting at 26 Hz, 31 Hz, 40 Hz, 50 Hz, and so on up to 20 kHz. Other numbers of bands are also common, though more than 3 bands per octave are generally rare. The graphic equalizer function implements second-order filter functions in each of the bands. The bandwidth sharpness (Q) around the center frequency of each band is typically fixed, but the level is adjustable through the sliders. The GUI for the graphical equalizer may also include a display area 204 that displays the frequency response of the combined effect of the current EQ filter settings, as well as a real-time Fourier-style frequency domain display of the audio output which shows the effect on the audio signal as the slider controls are changed.

Figure 2B:
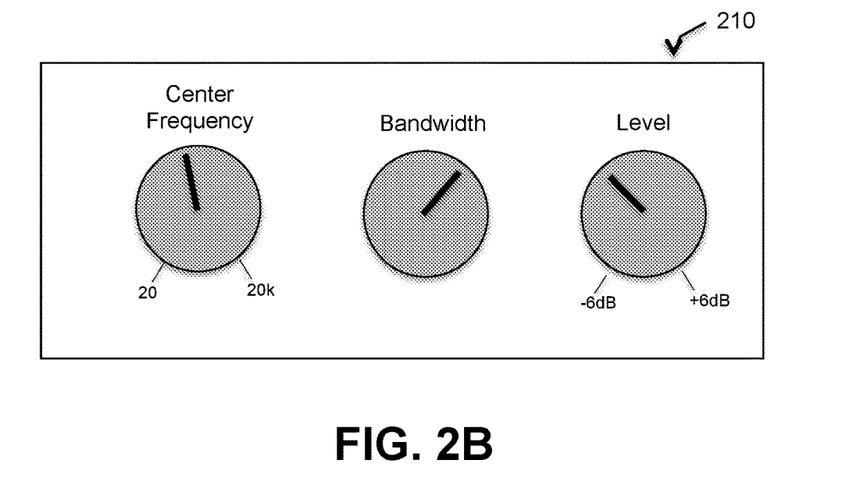
FIG. 2B illustrates an interface for a parametric equalizer and corresponding equalization functions that can be controlled through a DAW user interface according to some embodiments.

In an embodiment, the user interface for an audio system 104 controls a graphic equalizer with a large number of filter bands, such as on the order of 120 bands (12 bands per octave of the audio spectrum times 10 octaves over the frequency range). The interface is a hybrid between a traditional user interface for a graphical equalizer (e.g., shown in FIG. 2A) and a user interface for a parametric or parametric-type equalizer (e.g., shown in FIG. 2B). FIG. 2B illustrates an interface for a parametric equalizer and corresponding equalization functions that can be controlled through a user interface according to some embodiments. The example of FIG. 2B illustrates control of this equalizer through physical or user interface icon versions of rotary knobs (as opposed to the sliders of a graphic equalizer), however it should be noted that there are many possible ways of defining the settings of a parametric equalizer. For example, other types of potentiometers, such as switch banks, sliders and dragging control points on a curve on a GUI depicting the filter's response are other possible examples of the UI for a parametric EQ. In general, the parametric equalizer consists of only a few filter elements (e.g., 1-4) however each of those filter elements has more settings than any one of the filter elements of a graphic equalizer, allowing more detailed control of the effect of a given filter element, however the implementation is more complex and requires more user controls per filter element, so large numbers of such filters in an audio system are rare. For the embodiment of FIG. 2B, the parametric equalizer settings comprise the level (e.g. boost or cut), the center or primary frequency and the bandwidth or range (Q) of the frequency response of the equalizer. Like the graphic equalizer, each frequency can be increased or decreased by a desire amount (e.g., +/−6 dB or +/−12 dB), but unlike the graphic equalizer, the center frequency can be controlled over the entire spectrum to virtually any frequency as the frequency potentiometer is swept over the entire spectrum, as opposed to the finite center frequencies of the graphic equalizer. For example, whereas the graphic equalizer may have a control with a fixed center frequency of 20 Hz at a fixed Q value, a parametric equalizer can be adjusted to control a center frequency of 15 Hz, 25 Hz or 30 Hz (etc.) with a variable Q value. The bandwidth (also known as Q) control determines the shape of the bell curve of the filter response, varying it between a tall but thin curve and a shallow but broad curve around the selected center frequency. The effect of using multiple parametric filter elements is that their individual responses add together, with the resulting filter response covering the whole audio spectrum. In contrast, in a graphic equalizer the center frequencies of the individual bands are set so that they only minimally overlap each other and thus are essentially independent of each other.

Figure 3:
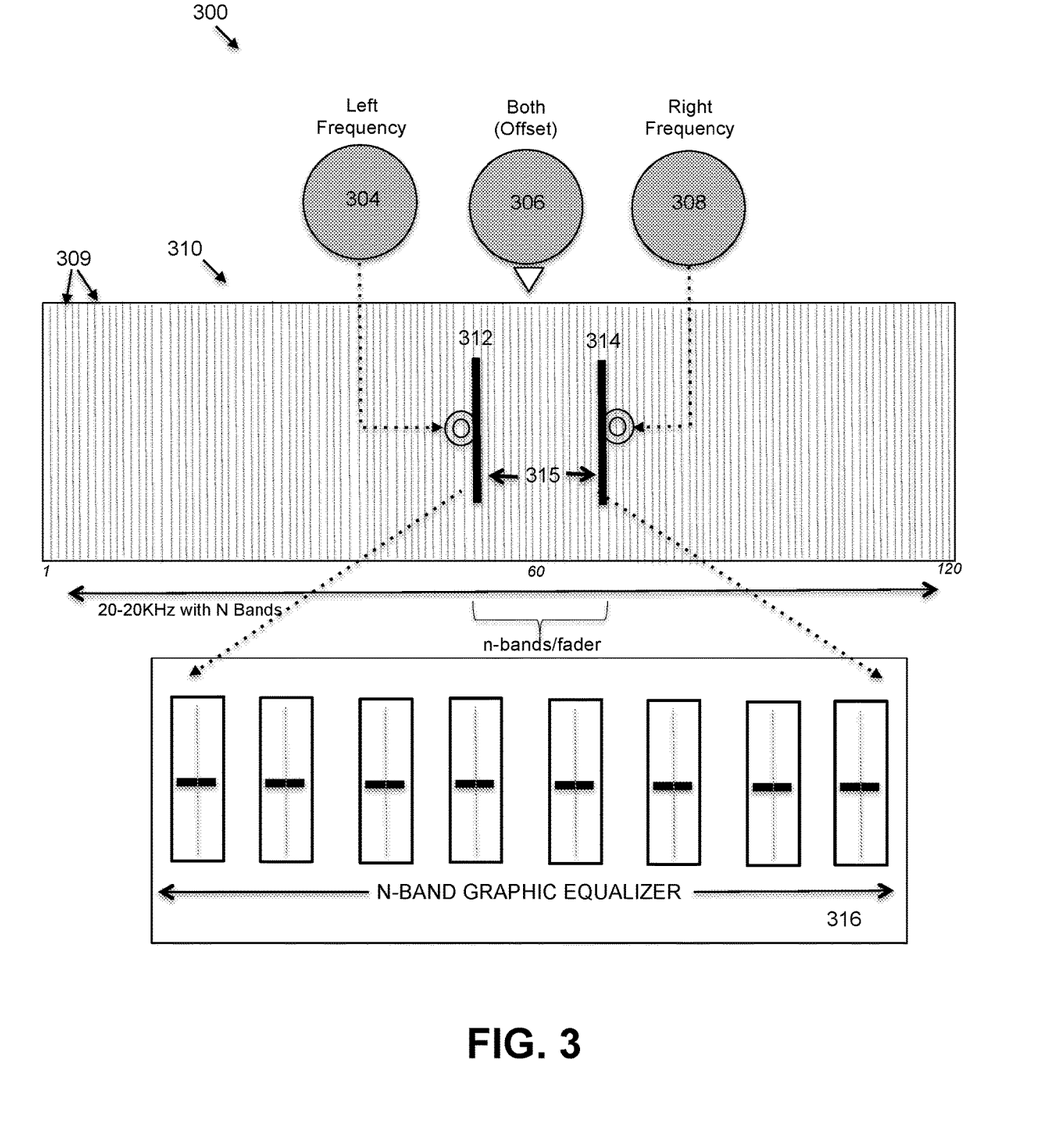
FIG. 3 illustrates a graphic user interface display for a hybrid equalizer under some embodiments.

FIG. 3 illustrates a graphic user interface display for a variable resolution equalizer under some embodiments. As stated above, the equalizer interface 300 provides control over an essentially "hybrid" equalizer that combines a traditional user interface for a graphical equalizer 316 and a user interface for a parametric or parametric-type equalizer. Specifically, the interface presents a fixed number of sliders (e.g., eight) to the user, along with a way to specify a frequency range that the sliders or any subset of the sliders control. For the example of interface 300, the frequency range control section comprises three control knobs 304 to 308. The control knobs adjust the frequency range desired for equalization, by including a Left Frequency knob 304, a Right Frequency knob 308, and an Offset knob 306 that adds an offset to the frequency range specified by the right and left frequencies. The Offset control 306 is generally provided for convenience, since the range can be unequivocally selected with only the left and right frequency knobs. Depending upon the frequency range selected with the control knobs 304 and 308 and the number (N) of filter bands available (i.e., filter elements implemented in the underlying equalizer implementation), a slider selection process is used to assign a range of adjacent EQ elements to each slider.

The GUI embodiment of FIG. 3 thus includes a method of providing control over an audio equalizer by providing controls 316 to equalize frequency response across the audio spectrum where each control sets gain values for a number of underlying EQ elements assigned to that control, and a second set of controls (304, 306, 308) which define the operation of controls 316. Control 304 sets a lower frequency limit value and control 308 sets an upper frequency limit value to define the frequency range, which in turn is used to determine the behavior of each fader 316. The slider selection process assigns to each fader a specific set of underlying EQ elements that may comprise elements similar to a fixed center frequency and Q element of a graphic EQ, and determines how the setting of the control affects the gain values thereby transmitted to the underlying EQ elements. The use of the slider selection process to determine the behavior of the fader implies that the values transmitted by the fader to its underlying EQ elements may or may not be linearly related to the setting of the fader control; in an embodiment, smoothing, curve-fitting, or other refinements may be utilized to achieve the desired resulting overall frequency curve of the equalizer system as a result of moving a given fader 316.

As an example, the embodiment of FIG. 3 shows an underlying graphic EQ implementation that is a 120-band equalizer (N=120) with bands 309 numbered from 1 to 120 with bands 1, 60, and 120 labeled (note that the illustration may not be exactly to scale). For this example, the frequency range bars 304 and 308 are configured to encompass selected bands 315, so that the full complement of 8 faders controls these frequency bands. Although FIG. 3 shows an EQ system with 120 bands, embodiments are not so limited, and N may be any practical number based on system capabilities and requirements. Thus, in a preferred embodiment, the graphic equalizer is a high-multiple band EQ, and N can be any number including up to 1000 bands. It should be noted that in general, the width of each of the bands 309 is invariant.

In general, the equalizer control operates over an audio spectrum comprising 20 Hz to 20 kHz (10 octaves) (though a greater range is also possible). The first set of controls (graphic EQ) comprises a set of M faders for an N-band graphic equalizer implementation, where N is any number between 30 and 1000, and M is any number much less than N, which is typically 8 or 16. The frequency range set by the second set of controls encompasses a K-band range, where K is the number of bands included in the range, for example with N=120 then bands/octave is 120/10 octaves=12 bands, thus a one octave range encompasses 12 bands) encompassing 12 bands per fader, and a minimum range set by a frequency range encompasses an eight band range having one band per fader (N=120, M=8, K=8, bands per fader=8/8=1).

FIG. 3 illustrates a general application of the variable resolution graphic equalizer GUI with respect to selecting a frequency range, dividing by the number of bands, and assigning these bands to faders. Other examples of possible configurations of the variable equalizer UI follow. For a first example, the user selects a frequency range spanning 2 octaves; this range spans a set of 24 filter elements (12 elements/octave*2=24); there are 8 faders available, so 3 EQ bands are automatically assigned to each fader (using a simple algorithm: 3 bands/fader=24 bands/8 faders). Moving a fader thus results in adjustment of 3 underlying EQ elements, according to the selection process (which may include a smoothing sub-process to smooth the resulting values to make them match more evenly with the adjacent bands). For a second example, the user selects a frequency range spanning 10 octaves; this range spans a set of 120 filter elements (12 elements/octave*10=120); there are 8 faders available, so 15 EQ bands are automatically assigned to each fader (using a simple algorithm: 15 bands/fader=120 bands/8 faders). Moving a fader results in adjustment of 15 underlying EQ elements. For a third example, the user selects a frequency range spanning 2/3 octave; this range spans a set of 8 filter elements (12 elements/octave*2/3=8); there are 8 faders available, so 1 EQ band is automatically assigned to each fader (using a simple relationship: 1 band/fader=8 bands/8 faders). Moving a fader results in adjustment of exactly one underlying EQ element, i.e. allowing control of the underlying equalizer to the finest degree theoretically possible for that EQ implementation. This user interface therefore does the work of a 120-fader graphic equalizer yet employs only 8 faders (and a frequency range selector). This reduction in number of controls allows each control to be displayed larger (making it easier to operate on a GUI) with the resulting set of controls still occupying far less GUI real estate than a 120-fader graphic EQ. In other words this EQ interface increases usability and decreases screen footprint while retaining the full frequency response adjustment capability of the underlying equalizer implementation.

As stated above, in the example embodiment of FIG. 3, the underlying graphic EQ implementation is an N-element equalizer where N equals 120 (12 bands/octave*10 octaves in the range 20 Hz-20 kHz). Such a 120-band EQ may be provided through a Lake EQ signal processing implementation, though other implementations are also possible, and N may be any practical number (for example from 30 to 1000) depending on implementation requirements and system capacity. For the 120-band embodiment of EQ 316, there are eight faders, where each fader controls a group of one or more graphic EQ bands; thus for a frequency range spanning 120 bands, each fader controls 15 bands (120/8=15). The number of bands controlled by each fader is typically equal and determined by the fader selection process. For example, given a frequency range of 1 octave, at 12 bands/octave there are 12 usable bands available, and 8 faders available, so the number of bands per fader is bands_in_frequency_range/number_of_faders, so 120/8=15. Alternatively, specific faders may be configured to control fewer or more bands than other faders according to the particular slider selection process used (for example in cases where bands_in_frequency_range/number_of_faders is not an integer). The operation of the faders in the graphic equalizer 316 is controlled by the settings of the frequency range controls in section 310. Range bars 312 and 314 are controlled respectively by the left frequency 304 and right frequency knob settings. In a touchscreen implementation of the GUI, the range bars 312, 314 could be dragged directly on the screen by a user sliding the bars accordingly. These range bars define a frequency range which in turn defines the number of EQ bands controlled by each fader.

Thus, for the example of FIG. 3, if the frequency range is set to a width of 2 octaves then this corresponds to 3 bands per fader (2 octaves*12 bands/octave=24 bands, 24 bands/8 faders=3 bands/fader). If the frequency range were narrowed to an 8-band range there would be one band per fader, and if it were widened to a 32-band range there would be 4 bands per fader. This relationship applies where there are eight faders 316, and other configurations of fader numbers are also possible. The case where the number of bands in the frequency range is not evenly divisible by the number of available faders can be addressed in many possible ways; one way is to limit the user's choices of frequency range widths, constraining them to only numbers of bands that do divide evenly. Another possible refinement is to only use a subset of the available faders, for example to allow use of band range counts that are divisible by 7, or 6, instead of only divisible by 8. It is also possible to make a more sophisticated algorithm which can dither the values to distribute the bands meaningfully among the available faders, or a simpler algorithm such as manual selection of number of bands/fader via a dedicated control; other solutions are also possible.

Figure 4:
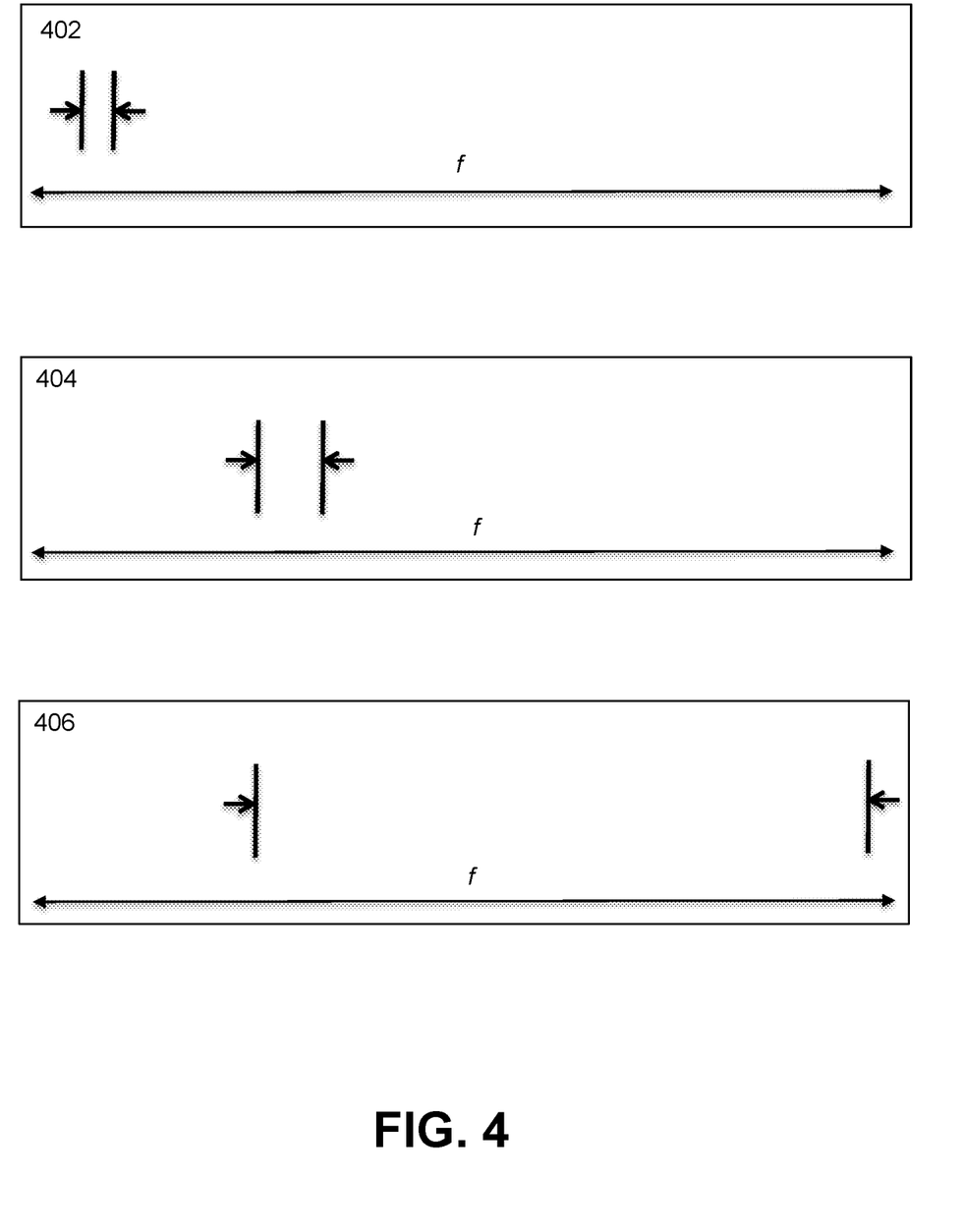
FIG. 4 provides an example illustration of possible settings of range bar for a hybrid equalizer interface under some embodiments.

The offset control knob 306 moves the frequency range defined by the range bars along the continuous frequency range 20 Hz to 20 kHz. As the width of the frequency range is changed, the number of graphic EQ bands controlled by each fader may change. For example, and as shown in FIG. 4, for frequencies from 20 to 1000 Hz, the range bars may be set to a narrow frequency range (i.e., containing a small number of bands, e.g., 8) (panel 402); the range bars may be set to contain a larger number bands, say 24 (panel 404); or they may be set to a width of 100 bands (panel 406). FIG. 4 is intended to provide example illustration only and any possible setting of range bar controls can be configured, and band lines 309 are not shown for purposes of clarity. It should be noted that a simple implementation may choose to limit the user's choices to widths with band counts that are evenly divisible by an available number of faders (for example by any integer between 1 and 8). It is also possible that the user may intentionally want to limit the number of faders, for example if they are assigning these controls to a programmable hardware control surface which only has a certain number of assignable controls available, for example 4 controls.

The embodiment of FIG. 3 illustrates selection of the frequency range 315 controlled by the graphic EQ controls (faders) 316 as set by the left and right frequency controls 304 and 308 with optional offset 306. In an alternative embodiment, the selected frequency range 315 may also be set by alternate controls for the second set of controls, such as a selector for "number of bands per fader" (e.g., 1-15 in the case of 120 bands and 8 faders, and an offset control to move the currently selected range along the audio range. Furthermore, the number of bands per fader could be specified separately for each fader, and the number of bands could be a very broad range; for example a 32-band fader would be useful if it matched a frequency range that had to be corrected all at once. For this embodiment, the width of the fader as displayed in the GUI could be proportional in some way to the number of bands it controls. In this manner, the variable resolution of each fader can be changed in the GUI to match approximately or proportionately, the respective resolution of the frequency range selection. In a further alternative embodiment, the system and GUI could be configured to include and control bands extending beyond the audible frequency range. For example, the Lake EQ implementation uses 120 bands for 20 Hz-20 kHz, but generally includes even more bands above and below that range, for a total of 131 bands (i.e. with the center 120 bands being 20-20 k). This illustrates that in general the number of bands is essentially non-critical, and any number of bands over various spectra of interest are possible.

In some embodiments, the interface additionally provides controls for specialized operations on two or more bands (e.g., curve smoothing). It is also possible to apply certain algorithms during operation of the interface to determine the vertical displacement (i.e., gain change) of each band. For example, if user raises a slider that affects several bands, the values of all bands mapped to that slider may rise by the same amount, or alternatively the bands near the edges of the range might be moved somewhat less ("scaled") to make the transition to the adjacent region less abrupt. Similarly the whole band range could behave as some kind of function or type shape (e.g., a sine wave) that controls the relation between moving a single control slider and its effect on each individual band mapped to that slider.

In an embodiment, the hybrid equalization interface may be implemented or provided as a plug-in application for certain audio processing software, such as Avid Pro Tools, or it may be integrated into any product that uses many-band EQ technology such as the Dolby CP850 Cinema Processor, or any other equalizer with a large number of filter bands. It may also be embodied as a standalone user interface control for a large multi-band equalizer. This user interface may even be applied in other domains in which a series of points define a curve that must be manipulated, for example a scientific device.

It should be noted that the components referred to as "control knobs," "faders," "sliders," "rotary knobs," and other similar descriptors may be implemented as potentiometers (variable resistors) in the form of rotary switches, linear switches or other variable resistance devices, and may be implemented as hardware components or virtual hardware (software) components that control certain audio processing or DSP processes such as gain control, as described herein. They may also be implemented by other technologies such as two-finger touchscreen gestures (for example a "pinch" motion to adjust the frequency range).

Figure 5:
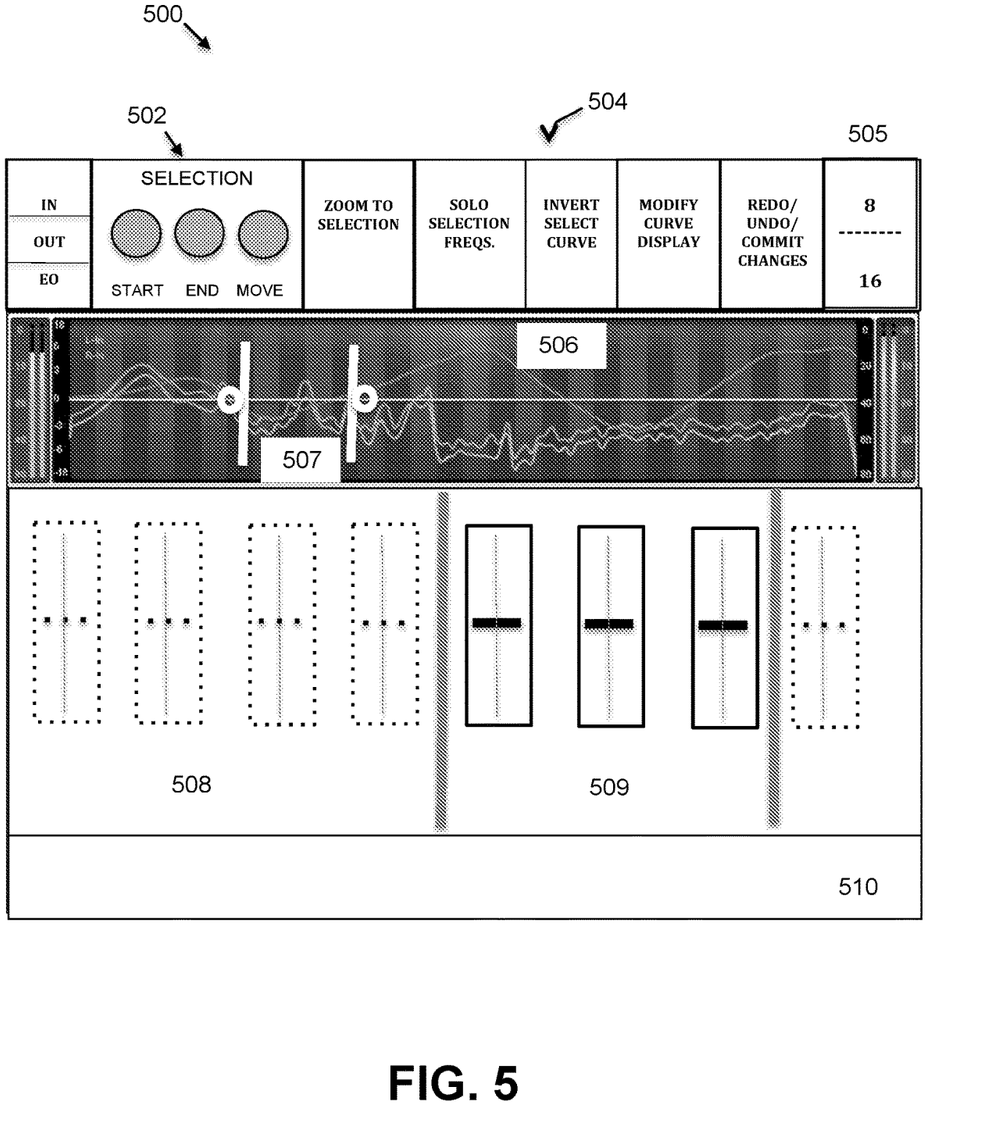
FIG. 5 illustrates an example hybrid equalizer incorporated into an EQ GUI, under some embodiments.

The user interface for the hybrid equalizer may include other graphical user elements and display areas for use as a stand-alone product or plug-in to other audio system software (or hardware) components. FIG. 5 illustrates an example hybrid equalizer incorporated into an equalizer GUI, under some embodiments. As shown in FIG. 5, the interface display consists of a number of different display areas including control area 504, frequency response and EQ curve display area 506, graphic EQ fader display area 508, and fader control area 510. The control area 504 includes certain input areas that control or invoke functions for the equalizer. The start, end and move buttons correspond to the Left/Right/Offset control knobs shown in FIG. 3. The display area corresponding to these settings is shown as a highlighted region 507 in the EQ curve within the frequency response display area 506. Certain other functions related to the selection process and settings may also be included in region 504; some examples are shown. Below the frequency response display area 506 is the graphic EQ fader control area 508. As described previously, the frequency range defined by the settings of the selection control knobs 502 affect the behavior of the faders, and one possibility is that certain of the faders will be active and others will be inactive (for example if the number of bands in the frequency range is divisible by 7 but not by 8 then only 7 faders might be active). Display area 509 is indicating that only 3 of the 8 faders are currently active. The selection of faders 509 may change as the selection area 507 is moved along the frequency response display area 506. A fader count selection control 505 could allow the user to select between 8 and 16 faders, since one number or the other may be more appropriate depending on the amount of display area available and ease of use (e.g. control size) considerations. Certain other functions related to the fader selections and settings may also be included as shown (but not limited to those shown) in optional control display region 510.

It should be noted that the components and arrangements of GUI elements in FIG. 5 are intended for illustrative example purposes only, and embodiments are not so limited. Many other configurations and components may be used or included depending on system requirements and applications. Standard GUI features such as highlighting, color-coding, mouse-over text insertion, hidden controls, and the like may be used in conjunction with the GUI display of FIG. 5.

The variable-resolution graphic equalizer described herein provides an improved way of controlling gain values across the entire audio spectrum using many narrow-band filters, for example (but not limited to) 120 filter elements. It provides the ability to select a frequency range for equalization and automatically map a set of sliders to the selected range based on the number of filter bands falling within the selected range.

Though embodiments have been described with respect to implementation as a software program for use in a software DAW, it should be noted that such embodiments can also be incorporated in a hardware equalizer. For a hardware system embodiment, the audio processor may implement analog and/or digital circuitry to process audio content provided in analog or digital format.

Embodiments are also implemented in certain sound processors, such as the CP850 Dolby Atmos Cinema Processor for use with cinema and spatial audio content, though any other similar cinema audio or professional/consumer audio process may also be used Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," and "hereunder" and words of similar import refer to this application as a whole and not to any particular portions of this application. When the word "or" is used in reference to a list of two or more items, that word covers all of the following interpretations of the word: any of the items in the list, all of the items in the list and any combination of the items in the list.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

Illustrative Embodiments

Embodiments are directed to a method of providing control over an audio equalizer by providing a first set of controls to equalize frequency response across an audio spectrum wherein each control of the first set of controls sets gain values for respective center frequencies, and providing a second set of controls which specify a frequency range within the audio spectrum which in turn determines a number of frequency bands of the audio spectrum controlled by the each control of the first set of controls. In this method, the first set of controls may be provided as faders implemented as linear variable resistance devices in a graphic equalizer format, and the second set of potentiometers may be provided as rotary knobs in a parametric equalizer format. The first set of controls and second set of controls may comprise graphical user interface elements controlling frequency-specific gain characteristics across the audio spectrum for a digital audio stream processed in a digital audio system. The first set of controls and second set of controls may comprise hardware components controlling gain characteristics across the audio spectrum for audio content processed in an analog or digital audio processing system.

Embodiments are further directed to a method of providing control over an N-band audio equalizer, wherein N≥30, the method comprising: providing a first set of M controls, wherein M<N, for equalizing frequency response across an audio spectrum by controlling gain values for frequency bands of the audio spectrum; and providing a second set of controls which specify a frequency range within the audio spectrum, wherein the K frequency bands of the audio spectrum falling within the specified frequency range are assigned to the first set of M controls for controlling the corresponding K gain values by the first set of M controls.

In an embodiment of any of the above methods, the second set of controls are configured to enable adjusting the size of the specified frequency range, i.e. increasing or decreasing the selected frequency range, to thereby adjust the number of frequency bands K controlled by the first set of M controls.

In an embodiment of any of the above methods, the second set of controls is configured to limit the specifying of the frequency range to frequency ranges for which K is divisible by M, and upon specifying a frequency range of K frequency bands K/M frequency bands are assigned to each control of the first set of M controls. In another embodiment of any of the above methods, the second set of controls is configured to limit the specifying of the frequency range to frequency ranges for which K is divisible by an integer greater than 1 and smaller than or equal to M, and upon specifying a frequency range of K frequency bands Z controls of the first set of M controls are selected and K/Z frequency bands are assigned to the selected Z controls of the first set of M controls. Optionally, the second set of controls is further configured to limit the specifying of the frequency range to frequency ranges for which K≥M.

In an embodiment of any of the above methods, the audio spectrum comprises 20 Hz to 20 kHz (10 octaves), the first set of controls comprises a set of M faders for an N-band graphic equalizer implementation (where N is any number between 30 and 1000, and M is any number much less than N, typically 8 or 16) further wherein a frequency range set by the second set of controls encompasses a K-band range (where K is the number of bands included in the range, for example with N=120 then bands/octave is 120/10 octaves=12 bands, thus a one octave range encompasses 12 bands) encompassing 12 bands per fader, and a minimum range set by a frequency range encompasses an eight band range having one band per fader (N=120, M=8, K=8, bands per fader=8/8=1).

The first and second set of controls may be provided as software elements in a software implemented equalizer program, and wherein the frequency range set by the second set of controls is displayed as a first highlighted region of a frequency response graph of the graphical user interface, and selected faders of the first set of controls and corresponding to the range may be displayed in a second highlighted region of a graphic equalizer portion of the graphical user interface. The method may provide curve smoothing between two or more adjacent bands as their values are controlled by faders, according to an algorithm. Embodiments are further directed to an equalizer system adjusting gain values for frequency components across a spectrum, having a first set of equalizer controls comprising a plurality of faders, each fader setting gain values for a set of filters each set to an adjacent but unique center frequency in the spectrum, and a second set of equalizer controls selecting a frequency range for equalization as controlled by the first set of equalizer controls and automatically mapping a subset of faders of the plurality of faders to the selected frequency range based on a number of filter bands falling within the selected frequency range. The second set of controls select a frequency range which defines the number of bands in that range, and through an algorithm determines the mapping of the set or subset of faders to the selected frequency range. The first set of equalizer controls may comprise a graphic equalizer having 8 or 16 (or any other integral number of) individual faders. In an embodiment, the graphic equalizer user interface controls a 120-band equalizer having 120 (or any number 30-1000) individual narrow-band filters applying gain values set by the plurality of faders.

Embodiments are further directed to an equalizer system adjusting gain values for N frequency bands across an audio spectrum, wherein N≥30, comprising: a first set of M equalizer controls for setting gain values for frequency bands of the audio spectrum, wherein M<N; and a second set of equalizer controls selecting a frequency range for equalization by the first set of M equalizer controls, wherein the K frequency bands falling within the selected frequency range are assigned to the first set of M controls for controlling the corresponding K gain values by the first set of M controls.

In an embodiment of any of the above systems, a full subset of faders comprises a 120-band (or any number N, 30-1000) range for eight (or any number F, e.g., 4 to 100) faders with bands per fader and a smallest subset of faders comprises an eight-band range with one band per fader. The equalizer system may be a hardware component for a hardware- or software-based audio processing system. The equalizer system may be a software program used in a digital audio system having a graphical user interface (GUI) for user control for products that are used for producing or reproducing audio. For the software embodiment, the first set of equalizer controls is displayed as a virtual graphic equalizer component having the faders as user-controllable graphic icons, and wherein the second set of equalizer controls provides a way to establish a frequency range, for example through the use of user-controllable rotary knobs. The selected frequency range may be displayed as a highlighted portion of a frequency response portion of the GUI, and wherein the subset of faders is displayed as a highlighted portion of the virtual graphic equalizer component.

Embodiments are yet further directed to a graphical user interface for controlling a graphic equalizer in a digital audio system, having a frequency response display area showing a frequency response curve over a spectrum for an audio program, a graphic equalizer display area showing a plurality of faders controlling gain values for respective center frequencies of the spectrum, and a set of controls which allow selecting a frequency range for equalization by the graphic equalizer stage and automatically mapping a subset of faders of the plurality of faders to the selected frequency range based on a number of filter bands falling within the selected frequency range. The selected frequency range is typically displayed as a highlighted portion of the frequency response display area, and wherein the subset of faders is displayed as a highlighted portion of the graphic equalizer display area. The faders may comprise 8 or 16 (or any other number of) individual faders. The graphic equalizer comprises an N-band equalizer having N individual narrow-band filters applying gain values set by the plurality of faders where N is any number between 30-1000. In an embodiment, a set of controls displayed in the display area define a left frequency marker, a right frequency marker, and optionally an offset knob for translating the markers together up or down within the 20 Hz-20 kHz audio frequency range.

Embodiments are yet further directed to a graphical user interface for controlling a graphic N-band equalizer in a digital audio system, wherein N≥30, comprising: a frequency response display area showing a frequency response graph over a spectrum for an audio program; a graphic equalizer display area showing a plurality of M first controls controlling gain values for frequency bands of the spectrum, wherein M<N; and a set of second controls which enable selecting a frequency range for equalization by the M first controls mapping a subset of the plurality of M first controls to the K frequency bands falling within the selected frequency range for controlling the corresponding K gain values by said subset of first controls.

In an embodiment, the subset may include less than M first controls, but may also include all of the M first controls.

Various aspects of the present invention may be appreciated from the following enumerated example embodiments (EEEs).

EEE 1. A method of providing control over an audio equalizer, comprising:
providing a first set of controls to equalize frequency response across an audio spectrum wherein each control of the first set of controls sets gain values for respective center frequencies; and providing a second set of controls which specify a frequency range within the audio spectrum which in turn determines a number of frequency bands of the audio spectrum controlled by each control of the first set of controls.

EEE 2. The method of EEE 1 wherein the first set of controls are provided as faders implemented as linear variable resistance devices in a graphic equalizer format, and wherein the second set of potentiometers are provided as rotary knobs.

EEE 3. The method of EEE 1 wherein the first set of controls and second set of controls comprise graphical user interface elements controlling frequency-specific gain characteristics across the audio spectrum for a digital audio stream processed in a digital audio system.

EEE 4. The method of EEE 1 wherein the audio spectrum comprises 20 Hz to 20 kHz of 10 octaves, and wherein the first set of controls comprises a set of M faders for an N-band graphic equalizer implementation, further wherein a frequency range set by the second set of controls encompasses a K-band range EEE 5. The method of EEE 4 wherein N is any number between 30 and 1000 and M is any number much less than N as in the range 8 to 24, and wherein K is the number of bands included in the range.

EEE 6. The method of EEE 5 wherein the first and second set of controls are provided as software elements in a software implemented equalizer program, and wherein the frequency range set by the second set of controls is displayed as a first highlighted region of a frequency response graph of the graphical user interface, and wherein selected faders of the first set of controls and corresponding to the range are displayed in a second highlighted region of a graphic equalizer portion of the graphical user interface, the method further comprising providing curve smoothing between two or more adjacent bands as their values are controlled by one or more faders.

EEE 7. An equalizer system adjusting gain values for frequency components across a spectrum, comprising:
a first set of equalizer controls comprising a plurality of faders, each fader setting gain values for a set of filters each set to an adjacent but unique center frequency in the spectrum; and
a second set of equalizer controls selecting a frequency range for equalization as controlled by the first set of equalizer controls and automatically mapping a subset of faders of the plurality of faders to the selected frequency range based on a number of filter bands falling within the selected frequency range.

EEE 8. The system of EEE 7 wherein the second set of controls selects a frequency range which defines the number of bands in that range, and through an algorithm determines the mapping of the set or subset of faders to the selected frequency range.

EEE 9. The system of EEE 8 wherein the equalizer system is one of: a hardware component for a hardware- or software-based audio processing system, or a software program used in a digital audio system having a graphical user interface (GUI) for user control for products that are used for producing or reproducing audio.

EEE 10. The system of EEE 9 wherein the first set of equalizer controls is displayed as a virtual graphic equalizer component having the faders as user-controllable graphic icons, and wherein the second set of equalizer controls provides a way to establish a frequency range, for example through the use of user-controllable rotary knobs.

EEE 11. The system of EEE 10 wherein the selected frequency range is displayed as a highlighted portion of a frequency response portion of the GUI, and wherein the subset of faders is displayed as a highlighted portion of the virtual graphic equalizer component.

EEE 12. A graphical user interface for controlling a graphic equalizer in a digital audio system, comprising:
a frequency response display area showing a frequency response curve over a spectrum for an audio program;

a graphic equalizer display area showing a plurality of faders controlling gain values for respective center frequencies of the spectrum; and a set of controls which allow selecting a frequency range for equalization by the graphic equalizer stage and automatically mapping a subset of faders of the plurality of faders to the selected frequency range based on a number of filter bands falling within the selected frequency range.

EEE 13. The graphical user interface of EEE 12 wherein the selected frequency range is displayed as a highlighted portion of the frequency response display area, and wherein the subset of faders is displayed as a highlighted portion of the graphic equalizer display area.

EEE 14. The graphical user interface of EEE 13 wherein the graphic equalizer comprises an N-band equalizer having N individual narrow-band filters applying gain values set by the plurality of faders, and wherein N is any number between 30-1000.

EEE 15. The graphical user interface of EEE 14 wherein a set of controls displayed in the display area define a left frequency marker, a right frequency marker, and optionally an offset knob for translating the markers together up or down within the 20 Hz to 20 kHz audio frequency range.

The invention claimed is:

1. A method of providing control over an N-band audio equalizer, wherein N>30, the method comprising:
   providing a first set of M controls, wherein M<N, for equalizing frequency response across an audio spectrum by controlling gain values for frequency bands of the audio spectrum;
   providing a second set of controls which specify a frequency range within the audio spectrum, the specified frequency range comprising a number, K, of frequency bands of the audio spectrum;
   assigning one or more unique frequency bands, of the K frequency bands, to a respective control of the first set of M controls; and
   displaying the specified frequency range through a graphical user interface, wherein the M controls are displayed as a highlighted portion of a graphic equalizer display area, and wherein left and right frequency markers displayed in the display area indicate lower and upper boundaries of the specified frequency range.

2. The method of claim 1, wherein the first set of M controls are provided as faders, and/or the second set of controls are provided as rotary knobs, and wherein each fader sets a gain of the one or more unique frequency bands, of the K frequency bands, assigned to the respective control.

3. The method of claim 1, wherein the first set of M controls and second set of controls comprise graphical user interface elements controlling frequency-specific gain characteristics across the audio spectrum for a digital audio stream processed in a digital audio system, and wherein a graphically, displayed offset knob translates the left and right frequency markers together up or down within the audio spectrum.

4. The method of claim 1, wherein the audio spectrum comprises 20 Hz to 20 kHz of 10 octaves.

5. The method of claim 1, wherein N is any number between 30 and 1000 and/or M is in the range 8 to 24.

6. The method of claim 1, wherein the second set of controls is configured to enable adjusting a size of the specified frequency range, thereby adjusting the number, K, of frequency bands.

7. The method of claim 6, wherein the second set of controls is configured to limit the specifying of the frequency range to frequency ranges for which the number, K, of frequency bands is divisible by M, and wherein upon specifying a frequency range, K/M frequency bands are assigned through the assigning step to each control of the first set of M controls.

8. The method of claim 6, wherein the second set of controls is configured to limit the specifying of the frequency range to frequency ranges for which the number, K, of frequency bands is divisible by an integer greater than 1 and smaller than or equal to M, and wherein upon specifying a frequency range, a subset number of controls of the first set of M controls comprising a value of K divided by the subset number defines frequency bands assigned through the assigning step to the subset number of controls of the first set of M controls.

9. The method of claim 8, further comprising smoothing two or more adjacent frequency bands as their values are controlled by one or more controls of the first set of controls.

10. An equalizer system adjusting gain values for N frequency bands across an audio spectrum, wherein N>30, comprising:
    a first set of M equalizer controls for setting gain values for frequency bands of the audio spectrum, wherein M<N;
    a second set of equalizer controls selecting a frequency range for equalization by the first set of M equalizer controls, the selected frequency range comprising a number, K, of frequency bands, wherein one or more unique frequency bands, of the K frequency bands, are each assigned to a respective control of the first set of M controls; and
    a graphical user interface displaying the specified frequency range, wherein the M controls are displayed as a highlighted portion of a graphic equalizer display area, and wherein left and right frequency markers displayed in the display area indicate lower and upper boundaries of the selected frequency range.

11. The system of claim 10, wherein the equalizer system is one of: a hardware component for a hardware- or software-based audio processing system, or a software program used in a digital audio system having a graphical user interface (GUI) for user control for products that are used for producing or reproducing audio,
    wherein optionally: the first set of M equalizer controls comprise M faders, and is displayed as a virtual graphic equalizer component having the M faders as user-controllable graphic icons, and the second set of equalizer controls provides a way to establish a frequency range, for example through the use of user-controllable rotary knobs.

12. A graphical user interface for controlling a graphic N-band equalizer in a digital audio system, wherein N>30, comprising:
    a frequency response display area showing a frequency response graph over for an audio spectrum of an audio program;
    a graphic equalizer display area showing a plurality of M first controls controlling gain values for a number, K, of frequency bands of the audio spectrum, wherein M<N; and
    a set of second controls which enable selecting a frequency range for equalization by the M first controls mapping a subset of the plurality of M first controls to the number, K, of frequency bands falling within the selected frequency range for controlling the corresponding K gain values by said subset of first controls, wherein the selected frequency range is displayed as a highlighted portion of the frequency response display area, and wherein the subset of first controls is displayed as a highlighted portion of the graphic equalizer display area, and wherein a left frequency marker indicating a lower boundary of the frequency range selected by the second controls and a right frequency marker indicating an upper boundary of the frequency range selected by the second controls are displayed in the frequency response display area.

13. The graphical user interface of claim 12, wherein the second controls comprise an offset knob for translating the left and right frequency markers together up or down.

14. A computer program product, comprising a non-transitory computer-readable medium having a computer-readable program code embodied therein, the computer-readable program code when executed by one or more processors causes the one or more processors to perform the method according to claim 1.

\* \* \* \* \*